United States Patent
Moon et al.

(10) Patent No.: US 10,141,345 B2
(45) Date of Patent: Nov. 27, 2018

(54) ARRAY SUBSTRATE, MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Jongwon Moon, Beijing (CN); Chuanyan Wang, Beijing (CN); Wenming Ren, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/382,174

(22) PCT Filed: Dec. 16, 2013

(86) PCT No.: PCT/CN2013/089519
§ 371 (c)(1),
(2) Date: Aug. 29, 2014

(87) PCT Pub. No.: WO2015/003464
PCT Pub. Date: Jan. 15, 2015

(65) Prior Publication Data
US 2015/0294986 A1 Oct. 15, 2015

(30) Foreign Application Priority Data

Jul. 8, 2013 (CN) .......................... 2013 1 0284582

(51) Int. Cl.
*H01L 27/12* (2006.01)
*H01L 21/768* (2006.01)
(Continued)

(52) U.S. Cl.
CPC ...... *H01L 27/124* (2013.01); *G02F 1/136286* (2013.01); *H01L 21/768* (2013.01);
(Continued)

(58) Field of Classification Search
None
See application file for complete search history.

(56) References Cited

U.S. PATENT DOCUMENTS

2008/0284967 A1* 11/2008 Oh .................... G02F 1/134363
349/144
2010/0073612 A1* 3/2010 Kim .................. G02F 1/136209
349/106
(Continued)

FOREIGN PATENT DOCUMENTS

CN 101241278 A 8/2008
CN 102981333 A 3/2013
(Continued)

OTHER PUBLICATIONS

Notification of the First Office Action dated Apr. 20, 2015 corresponding to Chinese application No. 201310284582.6.
(Continued)

*Primary Examiner* — Shaun Campbell
*Assistant Examiner* — Aneta Cieslewicz
(74) *Attorney, Agent, or Firm* — Nath, Goldberg & Meyer; Joshua B. Goldberg (57) ABSTRACT

The present invention provides an array substrate and a manufacturing method thereof, and a display device. The array substrate of the present invention comprises: common electrodes, pixel electrodes, common electrode lines and at least one auxiliary common electrode line, and the at least one auxiliary common electrode line is arranged to intersect with and be electrically connected to the common electrode lines. The manufacturing method of an array substrate of the
(Continued)

present invention comprises a step of forming common electrode lines and a step of forming auxiliary common electrode lines, wherein the auxiliary common electrode lines are arranged to intersect with and be electrically connected to the common electrode lines. The display device of the present invention comprises the above array substrate.

15 Claims, 6 Drawing Sheets

(51) Int. Cl.
*H01L 29/417* (2006.01)
*G02F 1/1362* (2006.01)

(52) U.S. Cl.
CPC .. *H01L 21/76802* (2013.01); *H01L 21/76877* (2013.01); *H01L 27/1248* (2013.01); *H01L 27/1288* (2013.01); *H01L 29/41733* (2013.01); *G02F 2001/136272* (2013.01); *G02F 2001/136295* (2013.01)

(56) References Cited

U.S. PATENT DOCUMENTS

| 2013/0027646 A1* | 1/2013 | Cho | G02F 1/133512 349/106 |
| 2013/0088677 A1 | 4/2013 | Kinoshita et al. | |
| 2013/0126876 A1* | 5/2013 | Shin | H01L 29/6675 257/59 |
| 2014/0043215 A1* | 2/2014 | Hu | G02F 1/134309 345/29 |

FOREIGN PATENT DOCUMENTS

| CN | 202975548 U | 6/2013 |
| CN | 203337969 U | 12/2013 |

OTHER PUBLICATIONS

Written Opinion of the International Searching Authority dated Apr. 22, 2014 corresponding to International application No. PCT/CN2013/089519.
Search Report issued in International Application No. PCT/CN2013/089519.

* cited by examiner

Fig. 1

(Prior art)

ARRAY SUBSTRATE, MANUFACTURING METHOD THEREOF, AND DISPLAY DEVICE

This is a National Phase Application filed under 35 U.S.C. 371 as a national stage of PCT/CN2013/089519, filed Dec. 16, 2013, and claims priority benefit from Chinese Application No. 201310284582.6, filed Jul. 8, 2013, the content of each of which is hereby incorporated by reference in its entirety.

FIELD OF THE INVENTION

The present invention relates to the field of liquid crystal display technology, and particularly relates to an array substrate and a manufacturing method thereof, and a display device.

BACKGROUND OF THE INVENTION

Currently, in the field of Thin Film Transistor-Liquid crystal display (TFT-LCD) technology, with the continuous updating of technology, LCD panels are developing rapidly towards large size.

In an Advanced Super Dimension Switch (AD-SDS, ADS for short) technology, a multi-dimensional electric field is formed of an electric field generated at edges of slit electrodes in the same plane and an electric field generated between a slit electrode layer and a plate electrode layer, and the multi-dimensional electric field enables liquid crystal molecules at all orientations both between the slit electrodes and right above the electrodes in a liquid crystal cell to rotate, thus enhancing work efficiency of liquid crystal and improving light transmittance. The ADS technology can improve picture quality of a TFT-LCD product and possesses advantages of high resolution, high transmittance, low power consumption, wide viewing angle, high aperture ratio, low chromatic aberration, no push Mura and the like.

Figure 1:
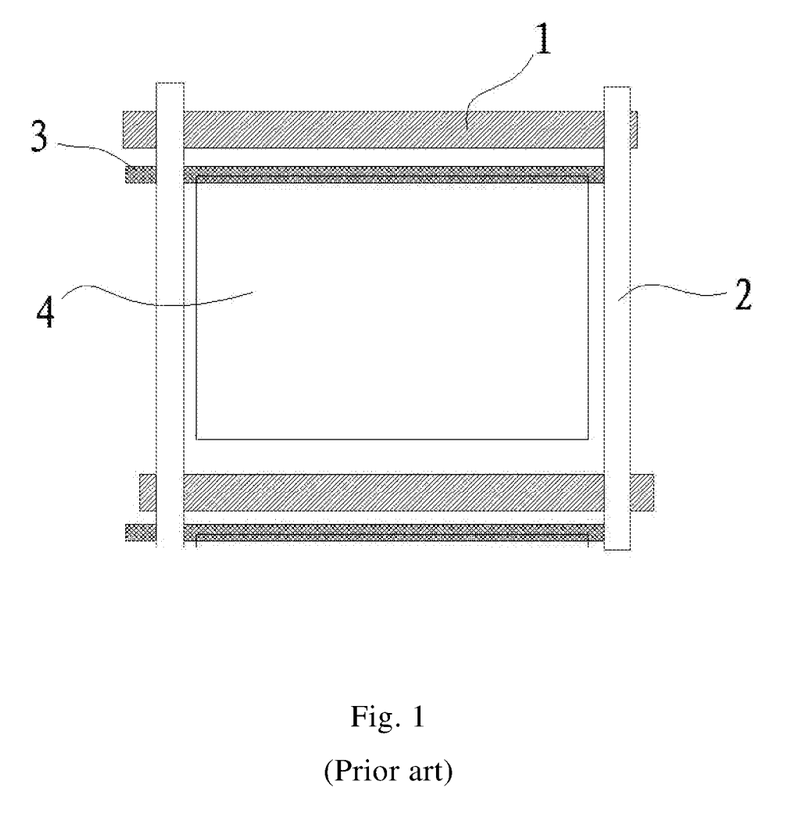
FIG. 1 is a schematic diagram of a structure of an Advanced Super Dimension Switch mode (ADS-mode) array substrate of the prior art.

As shown in FIG. 1, in an array substrate of an Advanced Super Dimension Switch mode (ADS-mode) LCD panel of the prior art, an area defined by two adjacent gate lines 1 and two adjacent data lines 2 is one pixel unit. In each pixel unit, a pixel electrode and a common electrode 4 corresponding thereto are included (only the common electrode 4 is shown in FIG. 1), the pixel electrode may be disposed above the common electrode 4 and an insulation layer is disposed between the pixel electrode and the common electrode 4. In displaying, a voltage of the pixel electrode is controlled by changing electrical signals applied to the gate line 1 and the data line 2, and a common voltage is applied to the common electrode 4 through a common electrode line 3, so that an electric field is generated between the pixel electrode and the common electrode 4 so as to control the rotation of liquid crystal.

In the prior art, the common electrode lines 3 and the gate lines 1 are arranged parallel to each other, and such arrangement may result in overlap capacitance between the common electrode lines 3 and the data lines 2 and further lead to crosstalk phenomenon. In addition, coupling capacitance exists between the data lines 2 and the common electrodes 4, and in this case, crosstalk is caused by data signals to the voltages of the common electrodes 4, which affects the uniformity and stability of the voltages of the common electrodes, and in turn affects the actual voltages applied to the liquid crystal and affects a display picture. With the continuous increase in size of the LCD panel, the uniformity and stability of the voltages of the common electrodes inside the LCD panel become important factors influencing picture quality of a large-size LCD panel. Instability of the voltages of the common electrodes may result in degradation in performance of the panel, for example, some phenomena such as greenish phenomenon and crosstalk phenomenon may occur. The greenish phenomenon refers to a phenomenon that under a certain display picture, since variations in voltages of the common electrodes due to data pulses on the pixel electrodes cannot cancel each other out, brightness of green pixels is increased to present a greenish colour. The crosstalk phenomenon is generated due to the overlap capacitance existing between the common electrode lines and the data lines.

In the prior art, the voltages applied to the common electrodes are adjusted in real time by designing and regulating a circuit for applying the voltages to the common electrodes so as to solve the problem of deterioration in uniformity and stability of the voltages of the common electrodes. However, for a large-size LCD panel, this real-time adjustment manner hardly works.

SUMMARY OF THE INVENTION

The technical problems to be solved by the present invention include providing an array substrate with improved uniformity and stability of voltage of a common electrode and a manufacturing method thereof, in view of the existing display panels (especially large-sized LCD panels).

According to an aspect of the present invention, an array substrate is provided, which comprises: common electrodes; pixel electrodes; common electrode lines; and at least one auxiliary common electrode line. The at least one auxiliary common electrode line is arranged to intersect with the common electrode lines and be electrically connected to the common electrode lines.

According to an embodiment of the present invention, each of the at least one auxiliary common electrode line may comprise a transparent conductive layer and a metal layer disposed on the transparent conductive layer.

According to an embodiment of the present invention, the at least one auxiliary common electrode line may comprise a plurality of auxiliary common electrode lines, and the number of pixel units between every two adjacent auxiliary common electrode lines is the same.

According to an embodiment of the present invention, the common electrodes may be slit electrodes, and the pixel electrodes may be plate electrodes. Alternatively, the common electrodes may be plate electrodes, and the pixel electrodes may be slit electrodes.

According to an embodiment of the present invention, the at least one auxiliary common electrode line may be disposed in the same layer as the pixel electrodes and is connected to the common electrode lines through via holes.

According to an embodiment of the present invention, the array substrate may further comprise data lines, the at least one auxiliary common electrode line is disposed above the data lines, and an insulation layer is provided between the at least one auxiliary common electrode line and the data lines. The insulation layer may have a thickness between 3000 Å to 10000 Å.

According to another aspect of the present invention, a manufacturing method of an array substrate is provided, the array substrate comprises common electrodes, pixel electrodes, common electrode lines and auxiliary common electrode lines, and the method comprises a step of forming the common electrode lines and a step of forming the auxiliary common electrode lines. The auxiliary common electrode lines are arranged to intersect with the common electrode lines and be electrically connected to the common electrode lines.

According to an embodiment of the present invention, the manufacturing method may comprise the following steps of: forming the common electrodes and the common electrode lines on a substrate before forming the auxiliary common electrode lines, wherein the common electrodes are plate electrodes; forming a passivation layer on the substrate formed with the common electrodes and the common electrode lines; forming data lines on the substrate formed with the passivation layer; forming an insulation layer on the substrate formed with the data lines; forming via holes in the insulation layer and the passivation layer, so as to expose at least a part of the common electrode lines; and forming the auxiliary common electrode lines and pixel electrodes on the insulation layer such that the auxiliary common electrode lines are electrically connected to the common electrode lines through the via holes.

According to an embodiment of the present invention, the step of forming the auxiliary common electrode lines and the pixel electrodes may comprise steps of: sequentially forming a transparent conductive material layer, a metal layer and a photoresist layer on the insulation layer; exposing and developing the photoresist layer to form a remaining photoresist layer, such that the remaining photoresist layer has a larger thickness in areas above the data lines than in display areas, and completely removing the photoresist layer between the display areas and the areas above the data lines and the photoresist layer in portions of the display areas where no pixel electrode is formed, so as to expose the metal layer thereunder, wherein the display areas are areas in which the pixel electrodes are to be formed; removing a part of the metal layer which are not covered by the reminding photoresist layer and the transparent conductive layer thereunder; removing the remaining photoresist layer in the display areas, so as to exposure the metal layer in the display areas; removing the metal layer exposed in the display areas, so as to expose the transparent conductive material layer thereunder and form the pixel electrodes; and removing the remaining photoresist layer in the areas above the data lines, so as to form the auxiliary common electrode lines.

According to an embodiment of the present invention, the photoresist layer may be exposed with a halftone mask or a gray-tone mask.

The array substrate according to the present invention may be applied to various display devices, particularly display devices with large-sized LCD panels.

Based on the concept of the present invention, a network of common electrode lines may be formed with the auxiliary common electrode lines and the common electrode lines, thus the uniformity and stability of the voltage of the common electrode of a large-size LCD panel can be improved.

Reference numerals: 1, gate line; 2, data line; 3, common electrode line; 4, common electrode; 5, pixel electrode; 6, auxiliary common electrode line; 61, transparent conductive layer; 62, metal layer; 7, passivation layer; 8, insulation layer; Q1, display area; Q2, area above data line.

DETAILED DESCRIPTION OF THE EMBODIMENTS

To enable those skilled in the art to better understand technical solutions of the present invention, the present invention will be further described below in detail in conjunction with the accompanying drawings and the specific implementations.

Figure 2:
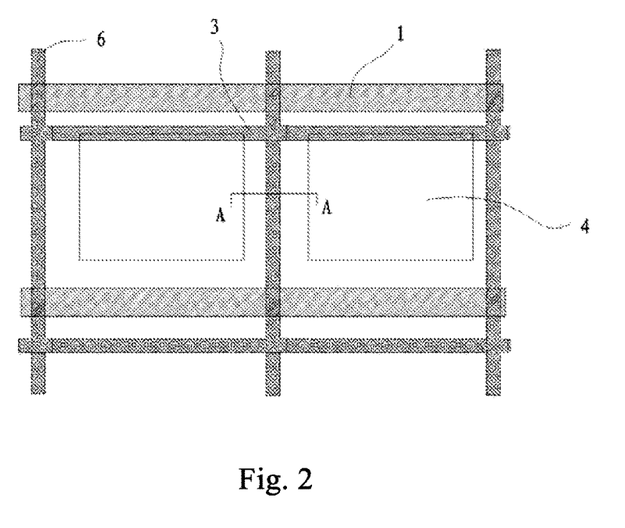
FIG. 2 is a schematic diagram of a structure of an ADS-mode array substrate according to an embodiment of the present invention.
Figure 3:
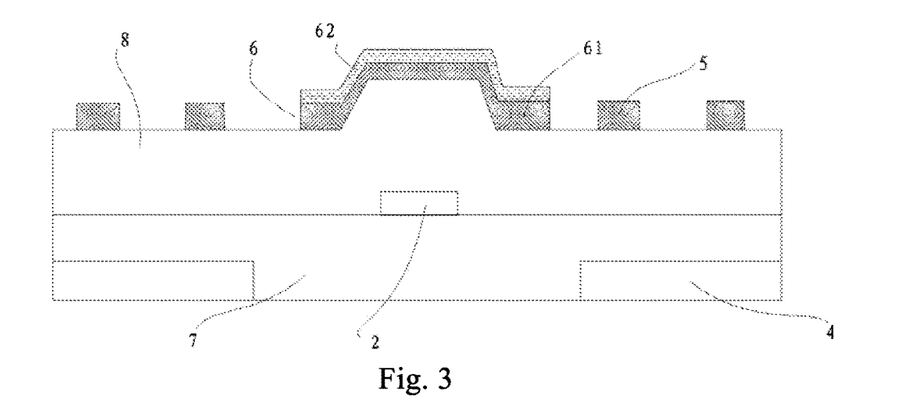
FIG. 3 is a sectional view taken along line A-A of FIG. 2.

FIG. 2 is a schematic diagram of a structure of an ADS-mode array substrate according to an embodiment of the present invention, and FIG. 3 is a sectional view taken along line A-A of FIG. 2.

Referring to FIGS. 2 and 3, an array substrate according to the embodiment of the present invention may comprise common electrodes 4, pixel electrodes 5, common electrode lines 3 and at least one auxiliary common electrode line 6. The auxiliary common electrode line 6 intersects with the common electrode lines 3 and is electrically connected to the common electrode lines 3.

As shown in FIG. 2, an area defined by two adjacent gate lines 1 and two adjacent data lines 2 is one pixel unit (in FIG. 2, the data lines 2 are located under the auxiliary common electrode lines 6), and in each pixel unit, pixel electrode 5 and common electrode 4 corresponding thereto are included. The common electrode lines 3 are connected to the common electrodes 4 and are arranged parallel to the gate lines 1. The pixel electrodes 5 may be slit electrodes, and the common electrodes 4 may be plate electrodes. Alternatively, the pixel electrodes 5 may be plate electrodes, and the common electrodes 4 may be slit electrodes.

As shown in FIG. 3, the pixel electrodes 5 (which are slit electrodes) are disposed above the common electrodes 4 (which are plate electrodes), and a passivation layer 7 and an insulation layer 8 are disposed between the pixel electrodes 5 and the common electrodes 4. The auxiliary common electrode line 6 may be disposed in the same layer as the pixel electrodes 5 and are electrically connected to the common electrode lines 3 through via holes passing through both the insulation layer 8 and the passivation layer 7. For example, it can be seen from FIG. 2 that, at a portion of an auxiliary common electrode line 6 where the auxiliary common electrode line 6 and a common electrode line 3 intersect, a small protrusion is formed leftwards (and/or rightwards) from the auxiliary common electrode line 6 and the via hole may be provided at said protrusion. Alternatively, the via holes may be provided at the portions where the auxiliary common electrode lines 6 and the common electrode lines 3 intersect, and the data lines 2 are formed to bypass positions where the via holes are to be formed, so as to avoid electrical connection with the common electrode lines 3 and the auxiliary common electrode lines 6.

The auxiliary common electrode lines 6 and the common electrode lines 3 are disposed to intersect with each other, such that a network of common electrode lines for applying common voltages to the common electrodes 4 is formed. The auxiliary common electrode lines 6 need to be electrically connected to the common electrode lines 3. According to different implementations, the auxiliary common electrode lines 6 may be electrically connected to the common electrode lines through the via holes, other connection modes can also be adopted, and the present intends to cover all these connection modes.

Since voltages are applied to the common electrodes 4 through the common electrode lines 3 and the auxiliary common electrode lines 6, the common electrode lines 3 and the auxiliary common electrode lines 6 need to be electrically connected to the common electrodes 4. As the common electrode lines 3 and the auxiliary common electrode lines 6 are generally not connected to other conductive patterns, it is necessary to provide the passivation layer 7 and the insulation layer 8 to avoid connection between the other conductive patterns and both the common electrode lines 3 and the auxiliary common electrode lines 6.

In the prior art, the common electrode lines 3 for applying common voltages to the common electrodes 4 are arranged parallel to the gate lines 1, and such arrangement may result in overlap capacitance between the common electrode lines 3 and the data lines 2 and further lead to crosstalk phenomenon. In addition, since coupling capacitance exists between the data lines 2 and the common electrodes 4, crosstalk is caused by data signals to the voltages of the common electrodes 4, the uniformity and stability of values of the actual voltages applied to the liquid crystal are thus affected, and display pictures are also affected.

In the array substrate according to the embodiment of the present invention, at least one auxiliary common electrode line 6 is added between pixel units, and the auxiliary common electrode line 6 and the common electrode lines 3 are arranged to intersect with each other to form a network of common electrode lines for applying common voltages to the common electrodes 4. Voltage loss at a side of a common electrode line 3, which is arranged parallel to the gate lines 1, away from the input common voltage signal can be compensated through an auxiliary common electrode line 6 arranged parallel to the data lines 2. Similarly, voltage loss at a side of an auxiliary common electrode line 6, which is arranged parallel to the data lines 2, away from the input common voltage signal can be compensated through a common electrode line 3 arranged parallel to the gate lines 1. Therefore, the uniformity and stability of the voltages of the common electrodes are guaranteed as a whole.

It should be understood that, the number and distribution of the at least one auxiliary common electrode line 6 may be specifically set based on requirements for uniformity of the voltage of the common electrodes and other requirements, which is not limited in the preset invention.

According to an embodiment of the present invention, the auxiliary common electrode line 6 may comprise a transparent conductive layer 61 (e.g. an Indium Tin Oxide layer) and a metal layer 62 disposed above the transparent conductive layer 61, as shown in FIG. 3.

It should be understood that, the electrical conductivity of the metal layer 62 may be better than that of the transparent conductive layer 61, since the auxiliary common electrode line 6 comprises the metal layer 62, the resistance of the auxiliary common electrode line 6 is decreased, which then decreases the voltage loss of the common electrode during the transmission of the voltages of the common electrodes along the auxiliary common electrode line 6, and further improves the uniformity and stability of the voltages of the common electrodes.

A material used to form the metal layer 62 may be metal with good electrical conductivity, such as copper, silver and the like, which is not limited in the present invention.

According to an embodiment of the present invention, the auxiliary common electrode line(s) 6 is disposed above the data lines 2, and an insulation layer 8 is disposed between the auxiliary common electrode line(s) 6 and the data lines 2.

The reason why the auxiliary common electrode line(s) 6 is disposed above the data lines 2 is that, in this case, the auxiliary common electrode line(s) 6 may be covered by a black matrix above the data lines 2, and thus the transmittance may not be affected.

Capacitance may be formed between the auxiliary common electrode line(s) 6 and the data lines 2, which has a certain impact on data voltages, and therefore, the thickness of the insulation layer 8 disposed between the auxiliary common electrode line(s) 6 and the data lines 2 needs to satisfy a certain condition so that the capacitance between the auxiliary common electrode line(s) 6 and the data lines 2 is smaller, thus diminishing adverse impact on the data voltages. The insulation layer 8 may have a thickness between 3000 Å to 10000 Å.

There may be a plurality of auxiliary common electrode lines 6, and the number of pixel units between every two adjacent auxiliary common electrode lines 6 is the same.

When the number of pixel units between every two adjacent auxiliary common electrode lines 6 is the same, the distance between every two adjacent auxiliary common electrode lines 6 is the same. In this case, respective grids of the formed network of common electrode lines have the same size, such that the network of common electrode lines has a better uniformity and the deviation of common voltages may be prevented to a great extent, which further improves display quality of a display to which such array substrate is applied.

According to an embodiment of the present invention, the common electrodes 4 may be plate electrodes, and the pixel electrodes 5 may be slit electrodes. Alternatively, the pixel electrodes 5 may be plate electrodes, and the common electrodes 4 may be slit electrodes.

In the array substrate according to the embodiment, the common electrodes 4 are disposed directly on the array substrate and the distance between the data line 2 and the common electrode 4 is small, and the coupling capacitance between the data lines 2 and the common electrodes 4 is large, such that crosstalk problem caused by data signals to the voltages of the common electrodes 4 becomes more serious, which makes the voltages of the common electrodes even more unstable. The network of common electrode lines formed of the auxiliary common electrode lines 6 and the common electrode lines 3 can effectively solve the problem of unstable voltages of the common electrodes, thus improving the uniformity and stability of the voltages of the common electrodes of a large-size LCD screen.

Figure 6:
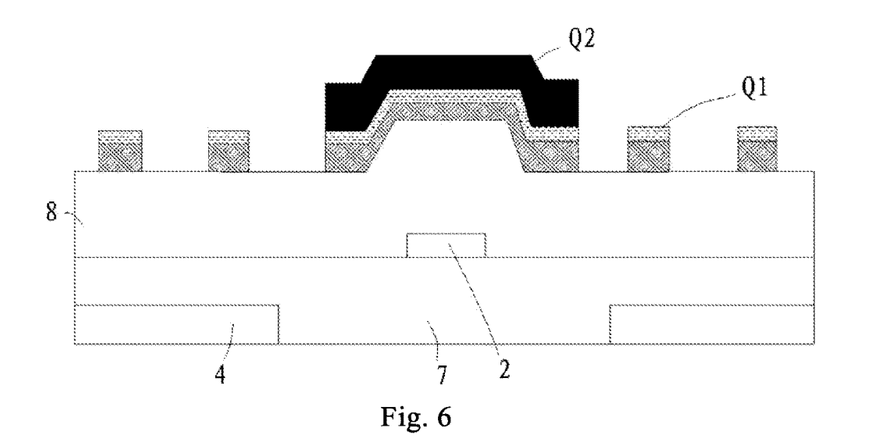
Figure 7:
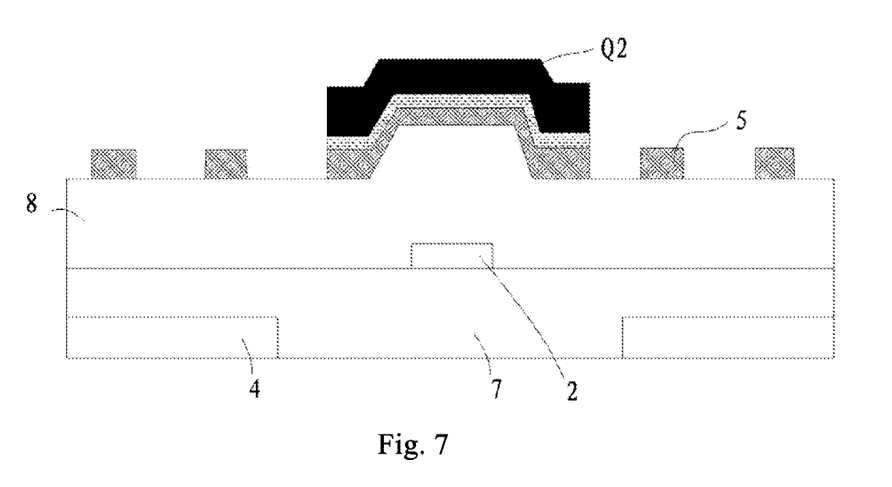
Figure 8:
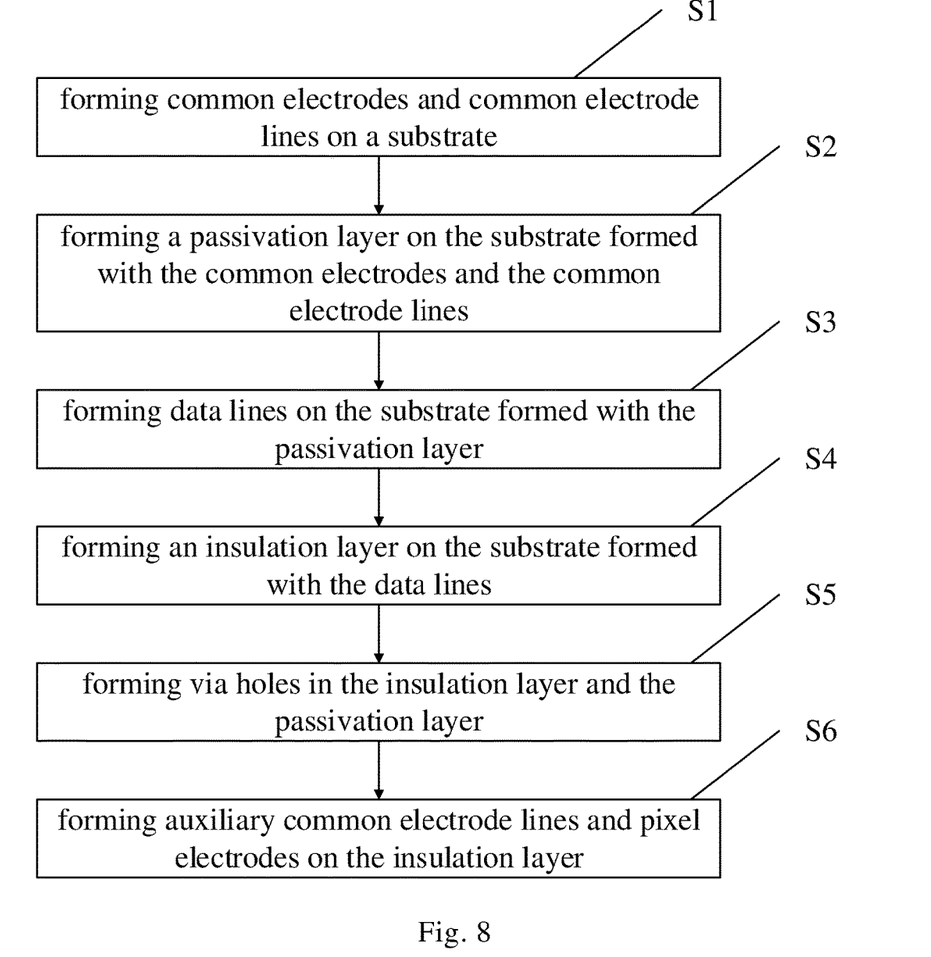
FIG. 8 is a flowchart illustrating a manufacturing method of an array substrate according to an embodiment of the present invention.
Figure 9:
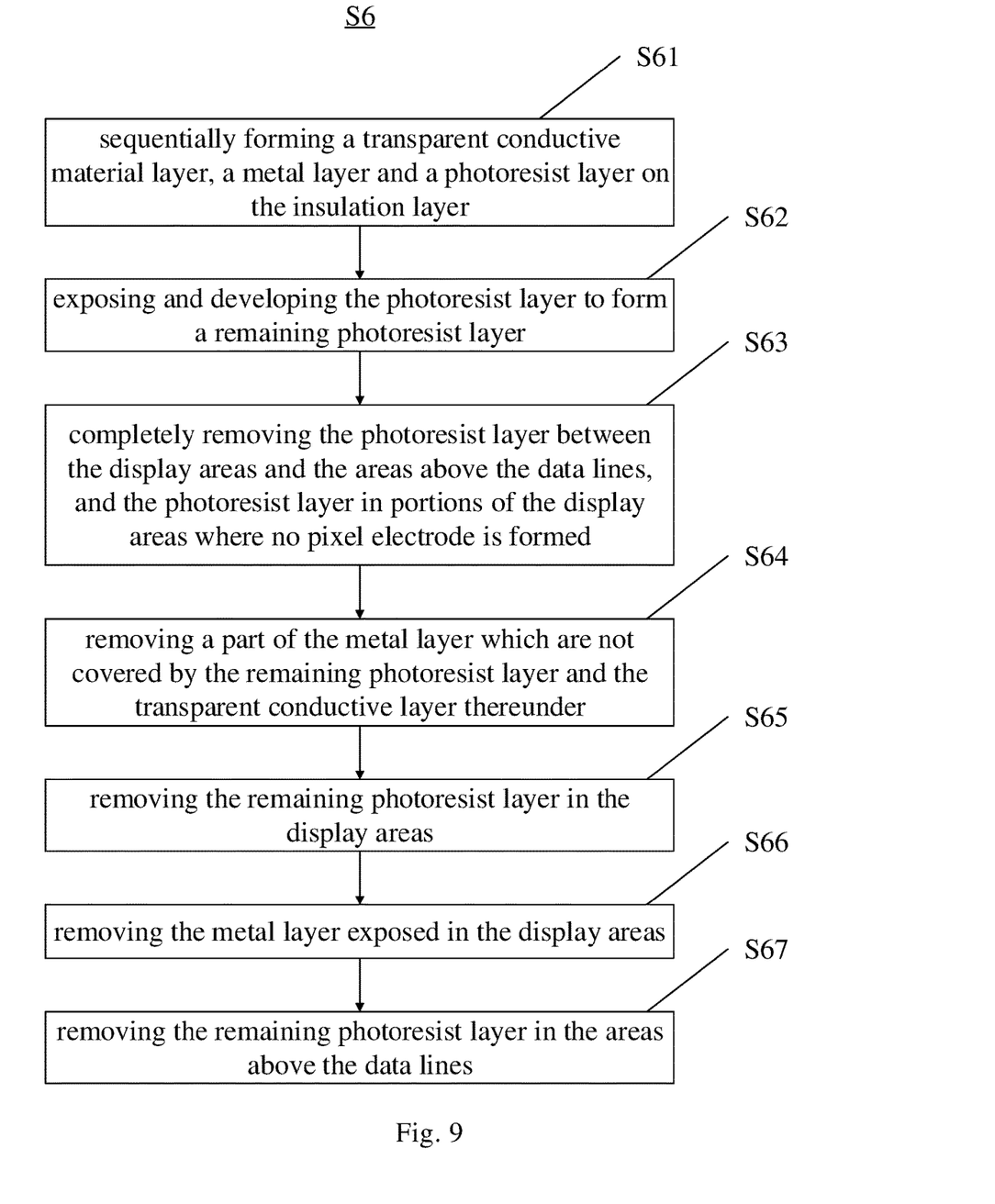
FIG. 9 is a flowchart illustrating a detail process of a step of forming auxiliary common electrode lines and pixel electrodes.

FIGS. 4 to 7 are structural schematic diagrams illustrating a manufacturing method of an array substrate according to an embodiment of the present invention, FIG. 8 is a flowchart illustrating a manufacturing method of an array substrate according to an embodiment of the present invention, and FIG. 9 is a flowchart illustrating a detail process of a step of forming auxiliary common electrode lines and pixel electrodes.

Referring to FIGS. 2 to 8, the manufacturing method comprises the following steps of:

forming common electrodes 4 and common electrode lines 3 on a substrate (step S1), wherein the common electrodes 4 are plate electrodes, and the common electrodes 4 are electrically connected to the common electrode lines 3 directly (as shown in FIG. 2);

forming via holes in the insulation layer 8 and the passivation layer 7, so as to expose at least a part of the electrode lines 3; and forming data lines 2 on the substrate formed with the passivation layer 7 (as shown in FIG. 3) (step S3);

forming an insulation layer 8 on the substrate formed with the data lines 2 (as shown in FIG. 3) (step S4);

forming via holes in the insulation layer 7 and the passivation layer 8 (step S5), so as to expose at least a part of the common electrode lines 3; and forming auxiliary common electrode lines 6 and pixel electrodes 5 on the insulation layer 8, such that the au, common electrode lines 6 intersect with the common electrode lines 3 and are electrically connected to the common electrode lines 3 through the via holes.

The above steps may be specifically set based on different requirements, for example, the steps of forming a gate, a source, a drain, gate lines, a gate insulation layer, an active region and the like may be included in the method, which is not limited in the present invention.

Figure 4:
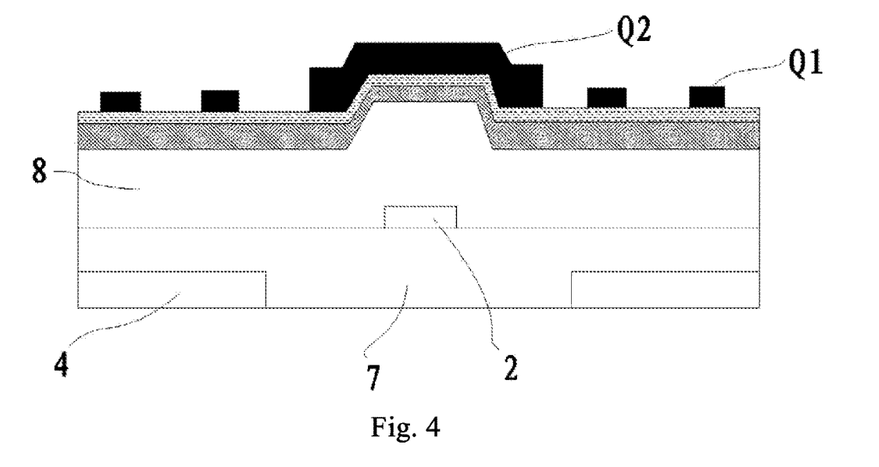
FIGS. 4 to 7 are structural schematic diagrams illustrating a manufacturing process of an array substrate according to an embodiment of the present invention.
Figure 5:
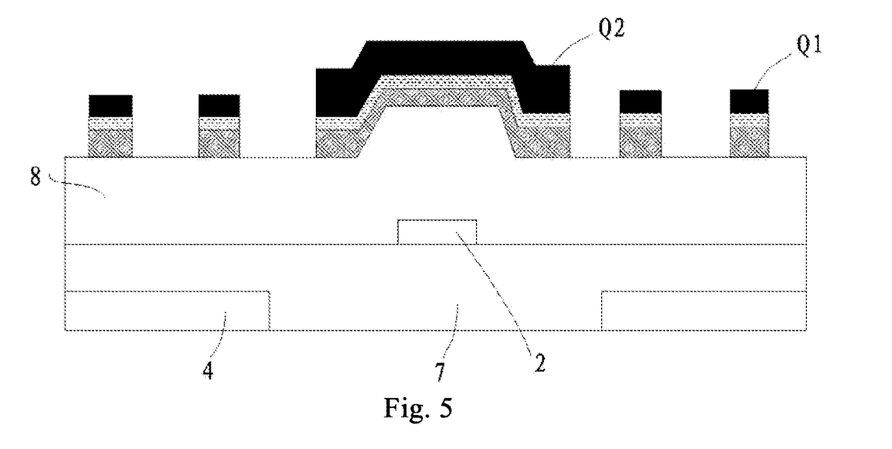

Referring to FIGS. 4 to 7 and 9, the step of forming the auxiliary common electrode lines 6 and the pixel electrodes 5 may comprise the steps of:

sequentially forming a transparent conductive material layer, a metal layer and a photoresist layer on the insulation layer 8;

as shown in FIG. 4, exposing and developing the photoresist layer to form a remaining photoresist layer (step S62), such that the remaining photoresist layer has a larger thickness in areas Q2 above the data lines 2 than in display areas Q1, and completely removing the photoresist layer between the display areas Q1 and the areas Q2 above the data lines 2 and the photoresist layer in portions of the display areas Q1 where no pixel electrode 5 is formed (step S63), so as to expose the metal layer thereunder, wherein the display areas Q1 are areas in which the pixel electrodes 5 are to be formed;

as shown in FIG. 5, removing a part of the metal layer which are not covered by the remaining photoresist layer and the transparent conductive layer thereunder (step S64);

as shown in FIG. 6, removing the remaining photoresist layer in the display areas Q1 (step S65), so as to expose the metal layer in the display areas;

as shown in FIG. 7, removing the metal layer exposed in the display areas Q1 (step S66), so as to expose the transparent conductive material layer thereunder and form the pixel electrodes 5; and as shown in FIG. 3, removing the photoresist layer remaining in the areas Q2 above the data lines 2 (step S67), so as to form the auxiliary common electrode lines 6.

The photoresist layer may be exposed with a halftone mask or a gray-tone mask. As such, exposures with different accuracies are performed on different areas of the same mask according to different requirements at the same time.

In the manufacturing method of an array substrate according to the embodiment, the transparent conductive layer 61, the metal layer 62 and the pixel electrodes 5 are formed through one patterning process at the same time, no additional process is added, and manufacturing cost is thus lowered.

In the manufacturing method of an array substrate according to the embodiment, the auxiliary common electrode lines 6 and the pixel electrodes 5 are formed in the same step. Alternatively, the auxiliary common electrode lines 6 and the pixel electrodes 5 may be formed in different steps. For example, when the auxiliary common electrode lines 6 is disposed in the same layer as the common electrode lines 3, the auxiliary common electrode lines 6 and the common electrode lines 3 may be formed at the same time.

In the manufacturing method of an array substrate according to the embodiment, the common electrodes 4 are formed as plate electrodes, and the pixel electrodes 5 are formed as slit electrodes. Alternatively, the pixel electrodes 5 may be formed as plate electrodes, and the common electrodes 4 are formed as slit electrodes. The process of the manufacturing method may be accordingly adjusted according to the formation of the common electrodes and the pixel electrodes.

The array substrate according to the embodiment of the present invention may be applied to various display devices. The display device may be any product or component with a display function, such as a mobile phone, a tablet computer, a television, a display, a notebook computer, a digital photo frame, a navigator or the like.

It can be understood that, the above implementations are merely exemplary implementations for explaining the principle of the present invention, but the present invention is not limited thereto. For those skilled in the art, various variations and improvements may be made without departing from the spirit and essence of the present invention, and these variations and improvements are also deemed as the protection scope of the present invention.

The invention claimed is:

1. An array substrate, comprising:
    common electrodes;
    pixel electrodes overlapped with the common electrodes in a direction perpendicular to the array substrate;
    common electrode lines;
    at least one auxiliary common electrode line formed in a same layer as the pixel electrodes;
    a passivation layer and an insulation layer provided between the common electrode lines and the at least one auxiliary common electrode line; and
    data lines provided between the insulation layer and the passivation layer,
    wherein the at least one auxiliary common electrode line is arranged to intersect with the common electrode lines and be electrically connected to the common electrode lines through via holes formed in the insulation layer and the passivation layer, and
    wherein the at least one auxiliary common electrode line is disposed overlapped with the data lines in the direction perpendicular to the array substrate, the at least one auxiliary common electrode line is arranged parallel to the data lines, and the insulation layer is provided between the at least one auxiliary common electrode line and the data lines.

2. The array substrate according to claim 1, wherein, the at least one auxiliary common electrode line comprises a transparent conductive layer and a metal layer disposed on the transparent conductive layer.

3. The array substrate according to claim 1, wherein, the at least one auxiliary common electrode line comprises a plurality of auxiliary common electrode lines, and the number of pixel units between every two adjacent auxiliary common electrode lines is the same.

4. The array substrate according to claim 1, wherein, the common electrodes are slit electrodes, and the pixel electrodes are plate electrodes.

5. The array substrate according to claim 1, wherein, the common electrodes are plate electrodes, and the pixel electrodes are slit electrodes.

6. The array substrate according to claim 1, wherein, the insulation layer has a thickness between 3000 Å to 10000 Å.

7. A display device, comprising the array substrate according to claim 1.

8. The display device according to claim 7, wherein, the at least one auxiliary common electrode line comprises a transparent conductive layer and a metal layer disposed on the transparent conductive layer.

9. The display device according to claim 7, wherein, the at least one auxiliary common electrode line comprises a plurality of auxiliary common electrode lines, and the number of pixel units between every two adjacent auxiliary common electrode lines is the same.

10. The display device according to claim 7, wherein, the common electrodes are slit electrodes, and the pixel electrodes are plate electrodes.

11. The display device according to claim 7, wherein, the common electrodes are plate electrodes, and the pixel electrodes are slit electrodes.

12. The display device according to claim 7, wherein, the insulation layer has a thickness between 3000 Å to 10000 Å.

13. A manufacturing method of an array substrate, the array substrate comprising common electrodes, pixel electrodes, common electrode lines and auxiliary common electrode lines, and the method comprising a step of forming the common electrode lines and a step of forming the auxiliary common electrode lines, wherein the auxiliary common electrode lines are arranged to intersect with the common electrode lines and be electrically connected to the common electrode lines, wherein the method comprises the following steps of:

forming the common electrodes and the common electrode lines on a substrate before forming the auxiliary common electrode lines, wherein the common electrodes are plate electrodes;

forming a passivation layer on the substrate formed with the common electrodes and the common electrode lines;

forming data lines on the substrate formed with the passivation layer;

forming an insulation layer on the substrate formed with the data lines;

forming via holes in the insulation layer and the passivation layer, so as to expose at least a part of the common electrode lines; and forming the auxiliary common electrode lines and pixel electrodes on the insulation layer, such that the auxiliary common electrode lines are electrically connected to the common electrode lines through the via holes, wherein the auxiliary common electrode lines are disposed overlapped with the data lines in a direction perpendicular to the array substrate, the auxiliary common electrode lines are arranged parallel to the data lines, and the insulation layer is provided between the auxiliary common electrode lines and the data lines.

14. The manufacturing method of an array substrate according to claim 13, wherein, the step of forming the auxiliary common electrode lines and the pixel electrodes comprises steps of:

sequentially forming a transparent conductive material layer, a metal layer and a photoresist layer on the insulation layer;

exposing and developing the photoresist layer to form a remaining photoresist layer, such that the remaining photoresist layer has a larger thickness in areas above the data lines than in display areas, and completely removing the photoresist layer between the display areas and the areas above the data lines, and the photoresist layer in portions of the display areas where no pixel electrode is formed, so as to expose the metal layer thereunder, wherein the display areas are areas in which the pixel electrodes are to be formed;

removing a part of the metal layer which is not covered by the remaining photoresist layer and the transparent conductive layer thereunder;

removing the remaining photoresist layer in the display areas, so as to expose the metal layer in the display areas;

removing the metal layer exposed in the display areas, so as to expose the transparent conductive material layer thereunder and form the pixel electrodes; and removing the remaining photoresist layer in the areas above the data lines, so as to form the auxiliary common electrode lines.

15. The manufacturing method of an array substrate according to claim 14, wherein, the photoresist layer is exposed with a halftone mask or a gray-tone mask.

* * * * *